US009470731B1

(12) United States Patent
Fischer et al.

(10) Patent No.: US 9,470,731 B1
(45) Date of Patent: Oct. 18, 2016

(54) TRANSVERSE ELECTROMAGNETIC CELL

(71) Applicant: FISCHER CUSTOM COMMUNICATIONS, INC., Torrance, CA (US)

(72) Inventors: Joseph F. Fischer, Redondo Beach, CA (US); Allen W. Fischer, Rancho Palos Verdes, CA (US); Bruce Harlacher, San Diego, CA (US); Eric Crittenden, Torrance, CA (US)

(73) Assignee: FISCHER CUSTOM COMMUNICATIONS, INC., Torrance, CA (US)

( * ) Notice: Subject to any disclaimer, the term of this patent is extended or adjusted under 35 U.S.C. 154(b) by 102 days.

(21) Appl. No.: 14/175,886

(22) Filed: Feb. 7, 2014

Related U.S. Application Data

(60) Provisional application No. 61/762,808, filed on Feb. 8, 2013.

(51) Int. Cl.
*G01R 27/32* (2006.01)

(52) U.S. Cl.
CPC ..................................... *G01R 27/32* (2013.01)

(58) Field of Classification Search
USPC ........... 324/612, 331, 200, 750.39, 201, 702
See application file for complete search history.

(56) References Cited

U.S. PATENT DOCUMENTS

| | | | | |
|---|---|---|---|---|
| 5,142,253 A | * | 8/1992 | Mallavarpu | H01P 5/12 333/127 |
| 5,436,603 A | * | 7/1995 | Fischer | G01R 29/0828 324/627 |
| 6,127,980 A | * | 10/2000 | Podgorski | G01R 29/0828 343/703 |

* cited by examiner

*Primary Examiner* — Melissa Koval
*Assistant Examiner* — Nasima Monsur
(74) *Attorney, Agent, or Firm* — Brooks Acordia IP Law, P.C.; Michael Zarrabian

(57) ABSTRACT

A TEM mode cell having an internal TEM element and at least one port on the cell comprising a stepped transmission line transformer coupling said element to the port. The cell comprises a hollow metallic housing having an enlarged center with opposite open ends, and a pair of end sections closing off said center open ends and tapering to a distal end of reduced cross sectional area. A connector at the distal end of each end section, and a stepped septum mounted within the housing and insulated therefrom, the septum coupled to and extending between the connectors. The septum having a central portion joining a pair of end portions each having a stepped contour reducing in size toward its connector. Each end portion has at least three steps in contour, with transition slopes between the steps being greatest leading to said central portion and the least leading to its connector.

9 Claims, 8 Drawing Sheets

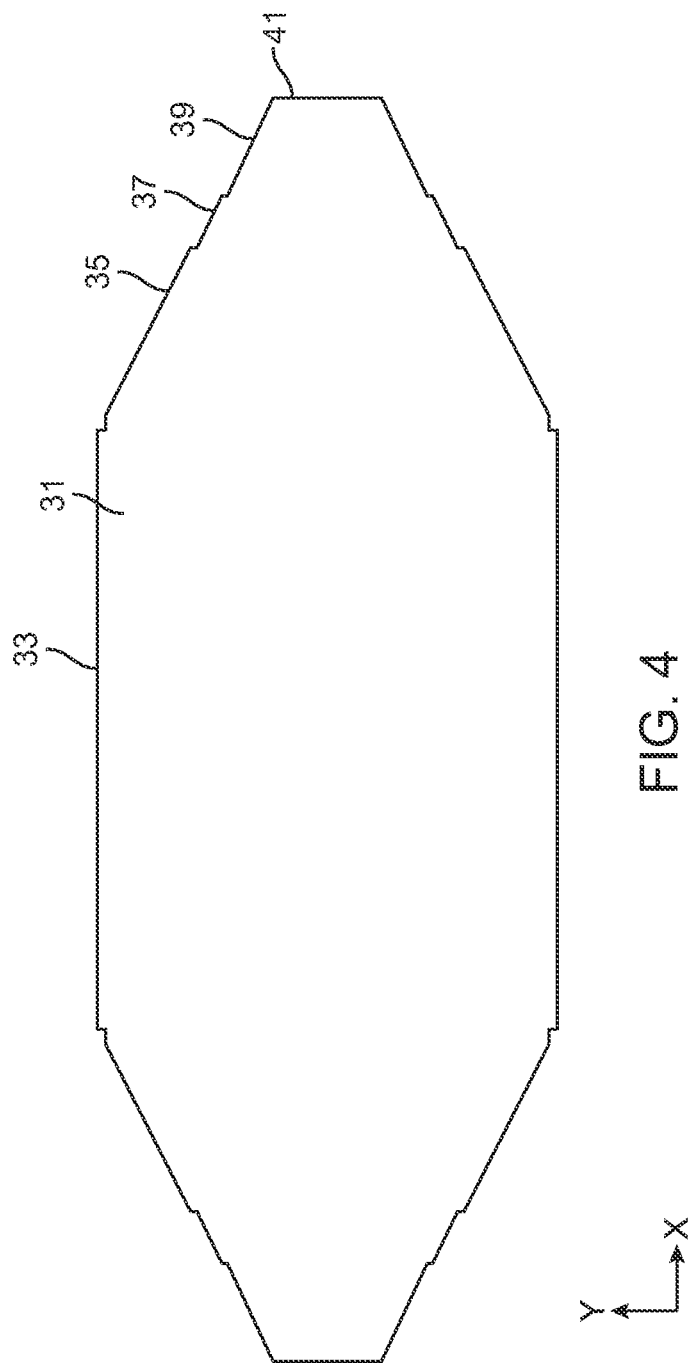

TRANSVERSE ELECTROMAGNETIC CELL

CROSS-REFERENCE TO RELATED APPLICATIONS

This application claims the priority benefit of U.S. Provisional Patent Application Ser. No. 61/762,808, filed Feb. 8, 2013, incorporated herein by reference in its entirety.

FIELD OF THE INVENTION

This present invention relates to transverse electromagnetic mode (TEM) test cells, and more particularly to performance of TEM test cells for bandwidth.

BRIEF DESCRIPTION OF RELATED ART

TEM test chambers or cells include a section of rectangular transmission line, operating in the transverse electromagnetic mode (TEM). The cell has tapered ends leading to a transition section that includes standard coaxial connectors defining two ports for the cell. Although typically a TEM cell has input and output ports, it may be useful, with proper internal loading, to provide only one connector port. The object of the design of TEM test chambers is to create a uniform electromagnetic field within the cell so as to effect measurements within +/−1 dB, while maintaining 50 ohm impedance throughout the cell including both ends.

Each cell is equipped with at least one access point that provides access to the working volume of the cell. Additional access openings may be provided for installation of test probes, connectors, and the like.

As background material for the type of TEM test cell to which the present invention pertains, reference is made to a U.S. Department of Commerce, National Bureau of Standards publication, NBS Technical Note 1013 entitled "Using a TEM Cell for EMC Measurements of Electronic Equipment", published April 1979 and authored by M. L. Crawford and J. L. Workman. The technical note may be ordered from the Superintendent of Documents, U.S. Government Printing Office, Washington, D.C., 20402, SD Stock No. SN003-003-02053-2.

In the aforementioned NBS publication, procedures are given for using a TEM cell for performing either standard radiated electromagnetic (EM) susceptibility testing or for measuring radiated EM emissions from electronic/electromechanical equipment. Embodiments of the present invention are useful for both types of operation.

BRIEF SUMMARY

In one embodiment of the present invention, a TEM mode test cell comprises a hollow metallic housing having an enlarged center section with opposite open ends, and a pair of end sections, each end section closing off a respective one of said center section open ends and tapering to a distal end of reduced cross sectional area. The TEM mode test cell further comprises a connector at each end section distal end, and a septum. The septum is mounted within said housing and insulated therefrom. The septum is coupled to and extending between said connectors and having a central portion joining a pair of end portions, each said end portion having a stepped contour and reducing in size toward its associated connector. Each said septum end portion has at least three steps in its contour, the slope of the transitions between steps being greatest leading to said septum central portion and being the least leading to its associated connector.

In one embodiment, the cross sectional dimension of each said septum end portion at its smallest end is approximately one fourth the cross sectional dimension of said septum central portion. In one embodiment, each septum end portion is stepped three times, and the ratio of the widest cross-sectional dimension to the axial length of the widest step is approximately 2.5 to 1. In one embodiment, the ratio of the widest cross-sectional dimension to the axial length of the middle step is approximately 5 to 1.

In one embodiment, the ratio of the widest cross-sectional dimension to the axial length of the narrowest step is approximately 2 to 1. In one embodiment, the length of each step, the cross sectional dimension at each step, and the slope of each transition between steps are predetermined to minimize voltage standing wave ratio (VSWR) within said cell. In one embodiment, said predetermined lengths, dimensions, and slopes are determined empirically.

These and other features, aspects and advantages of the present invention will become understood with reference to the following description, appended claims and accompanying figures.

BRIEF DESCRIPTION OF THE DRAWINGS

FIG. 4 shows a plan view of a TEM mode test cell septum, according to an embodiment of the present invention;

The embodiments are illustrated by way of example, and not by way of limitation, in the Figures of the accompanying drawings and in which like reference numerals refer to similar elements.

DETAILED DESCRIPTION

Figure 1:
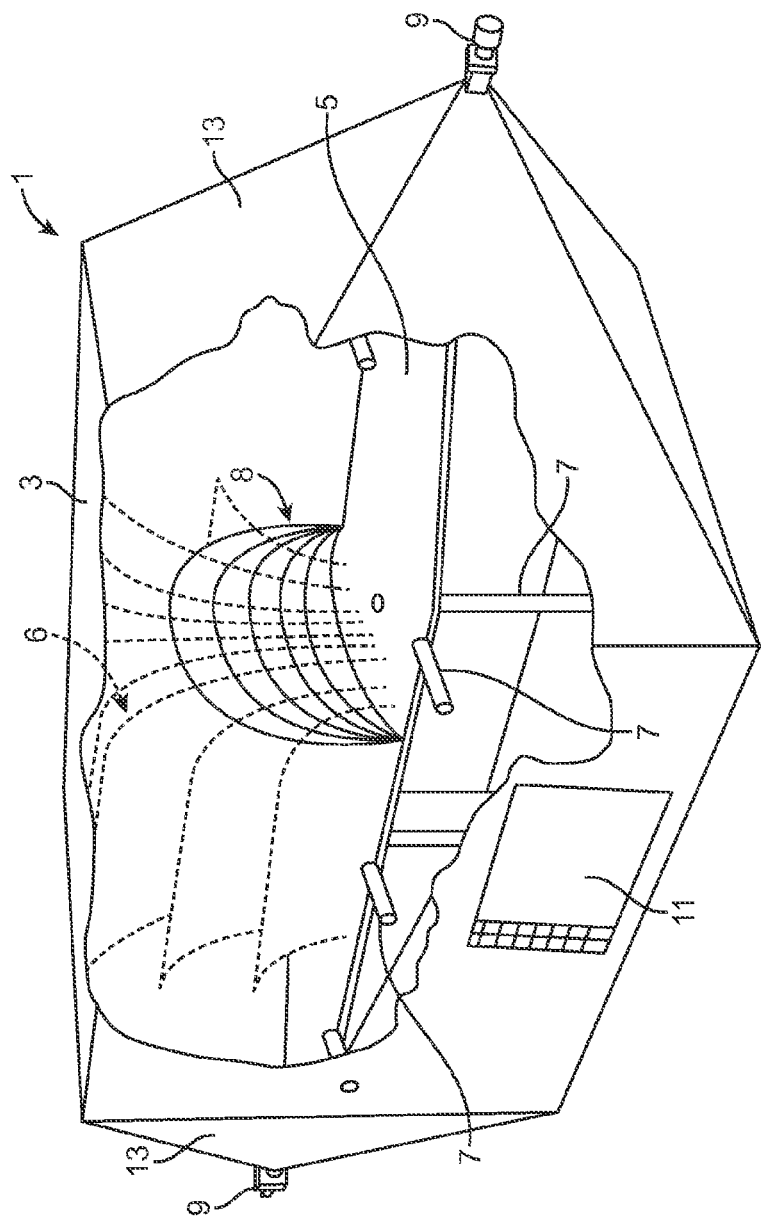
FIG. 1 shows a typical prior art TEM mode test cell.

Embodiments of the invention provide a method and apparatus for improved impedance matching arrangement which accomplishes the objective of lowering the VSWR while not having an adverse effect on the electromagnetic field in the center of a cell.

In a preferred embodiment, the present invention provides a TEM mode cell having an internal TEM element and at least one port on the cell, the cell comprising a stepped transmission line transformer coupling the internal TEM element to the port. The stepped transmission line transformer of the TEM mode cell has transfer characteristics selected to give maximum cancellation of VSWR in the cell and thereby enable optimum cell bandwidth.

The TEM mode test cell comprises a hollow metallic housing having an enlarged center section with opposite open ends, and a pair of end sections, each end section closing off a respective one of the center section open ends and tapering to a distal end of reduced cross sectional area. A connector is provided at the distal end of each end section, and a stepped septum is mounted within the housing and insulated therefrom, the septum coupled to and extending between the connectors.

The septum has a central portion joining a pair of end portions, each said end portion having a stepped contour and reducing in size toward its associated connector, wherein each said septum end portion has at least three steps in its contour, the slope of the transitions between steps being greatest leading to said septum central portion and being the least leading to its associated connector.

Generally, TEM cells allow performing electromagnetic interference/electromagnetic compatibility (EMI/EMC) measurements. A TEM cell includes a section of rectangular, coaxially line that serves as a broadband, linear phase and amplitude transducer (in the sense that it converts field strength to rf voltage or rf voltage to field strength) either to establish standard TEM fields for susceptibility testing of electronic equipment or for detecting radiated emanations from electronic equipment. The cell is bounded by a shielded metallic enclosure or housing, thus providing electrical isolation for the tests being performed.

In the center of a TEM cell is a conductor, formed of a flat sheet of metal supported by dielectric rods in the center of the cell. Access to the cell is by an access panel located on one side of the cell.

The center conductor, referred to in the field as a septum, is required to have a specific geometry and spacing from the shielded housing enclosure in order to generate the TEM wave in the center of the cell and maintain the correct impedance. In order to place the objects under evaluation inside the cell, it is desirable to have the center section of the septum and shielded housing as large as possible.

It has been found that in order to generate a reasonably uniform field at the center of the septum, the minimum lateral width of the septum and the dimensions of the shielded enclosure are such that the characteristic impedance at the center of the septum must be maintained at a constant impedance throughout the cell, typically 50 ohms due to the characteristic impedance of common measurement systems. Since the electrical connectors attached to the ports of the cell typically have a characteristic impedance of 50 ohms, it is necessary to employ some means of maintaining the 50 ohm impedance along the entire length of the cell.

Conventionally, achieving a low voltage standing wave ratio (VSWR) has been accomplished by providing a triangular shaped or linearly tapered end sections of the septum, narrowing toward the connector ports. Since the shielded housing enclosure also tapers toward the connector ports, it will be appreciated that maintaining a perfectly matched 50 ohm characteristic impedance during the transition is difficult. In order to make the smoothest transition between the 50 ohm cables attached to the connector ports and the septum, careful control of the shape of the tapered section of the septum is critical.

A TEM mode wave is characterized by orthogonal electric and magnetic fields which are perpendicular to the direction of propagation along the length of the cell or transmission line. The electric and magnetic field components are very uniform over approximately one third the volume between the septum and the outer wall of the cell. The field simulates the electromagnetic plane wave fields generated in free space.

The TEM mode has no low frequency cutoff. This allows the cell to be used at frequencies as low as desired. The TEM mode has linear phase and constant amplitude response as a function of frequency. This makes it easy to use the cell to generate or detect a known and well-defined field intensity. The upper useful frequency for a cell, however, is limited by distortion of the test signal caused by resonances and multi-moding that occur within the cell. These effects are a function of the physical size of the cell and its components.

The quality of the electrical characteristics of a cell as a transmission line can be measured using scattering parameters (S-parameters).

The field generated inside the cell can be calculated by: $E=V/x$, wherein E is field generated in volts/meter, x is separation between the center plate (septum) in meters and the outer wall, and V is voltage injected at the input port.

The TEM field can be produced with an accuracy of +/−1 dB up to a frequency where the higher order modes are generated within the cell. The first resonance is demonstrated by a high VSWR over a narrow frequency range. The high Q of the cell is responsible for such high VSWR. Insertion loss is measured by comparing the ratio of the power at the output port compared to the power at the input port of the cell.

As noted, one technique for impedance matching to lower the cells VSWR is to introduce conjugate impedance matching elements at the input and output ports of the cell. While effective, these techniques can create higher order modes in the near vicinity of the input and output ports which limit the bandwidth of the cell. While prior art devices, making use of a linear taper of the ends of the septum, have successfully reduced the VSWR within the cell, the lumped impedance matching elements at the ports create extreme distortions in field structure, resulting in a less uniform field where it is desired, i.e., at the center of the cell.

FIG. 1 shows a typical prior art TEM mode test cell 1 with a portion of the outer housing 3 cutaway to show the internal septum 5 and the representation of the electric and magnetic fields 6, 8 generated or imposed upon the center of the septum 5. The septum 5 is insulated from the housing 3 by means of a plurality of insulator elements 7. The port connectors 9 at each end of test cell 1 are shown attached to the narrowed end of the tapered end portions 13 of housing 3. For access into the interior of test cell 1, an access panel 11, or a plurality of access panels, is provided, appropriately designed for permitting cables to be run into and out of the interior of the test cell.

Figure 2:
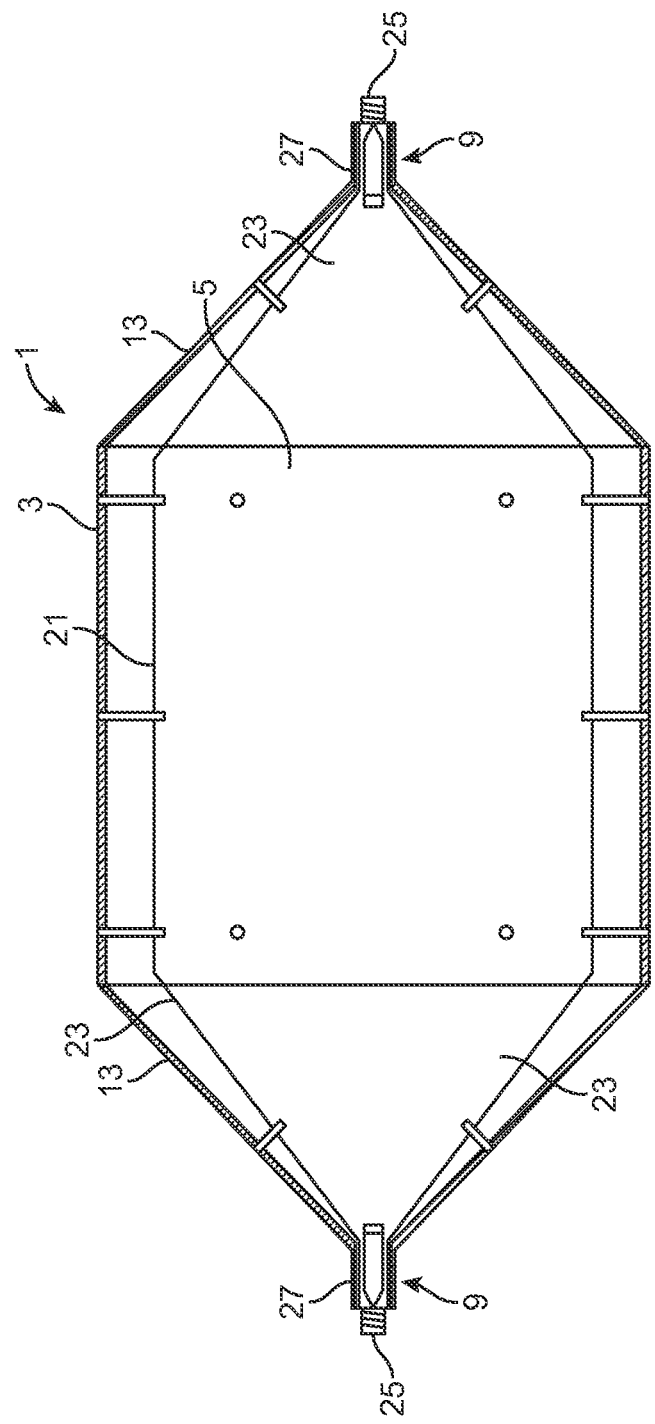
FIG. 2 is a partial cross sectional top view of the test cell of FIG. 1.

FIG. 2 is a partial cross sectional top view of the test cell 1 in which the insulatively supported septum 5 is shown according to a prior art construction. As will be observed, the septum 5 has a rectangular planar central portion 21 and linearly tapered planar end portions 23 leading to the end connector port terminals 9, shown in FIG. 2 to be provided with a threaded end 25 for direct connection to a coaxial cable in a manner known in the prior art. The outer tapering portion 13 of the housing 3, shown at 13, narrows down to a tubular nose portion 27 which physically mounts the terminal 9.

Figure 3:
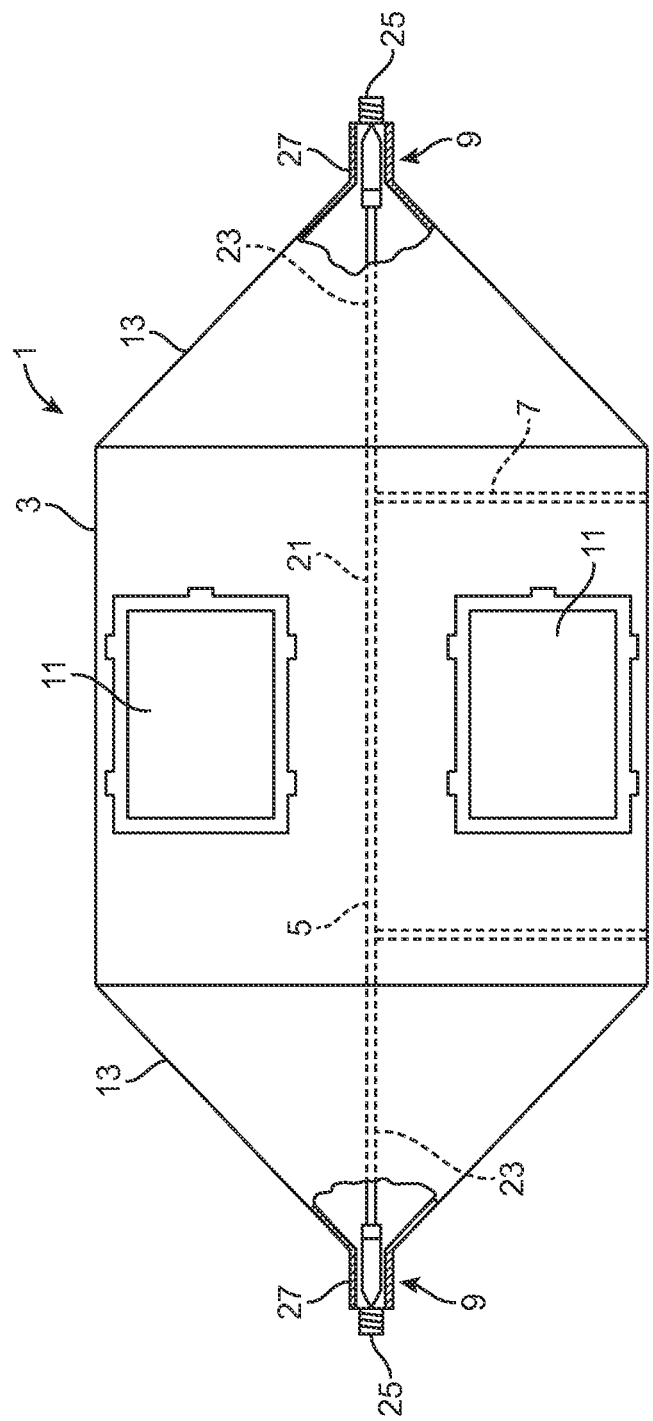
FIG. 3 is the prior art TEM mode test chamber of FIG. 1, shown in a side view with a septum, shown in phantom.

In FIG. 3, the prior art TEM mode test chamber 1 is shown in a side view with the septum 5 shown in phantom. As is typical in such prior art test chambers, the septum 5 is a flat plate-like element such as brass and is supported in all directions by a number of dielectric insulators 7.

As noted, embodiments of the invention provide method and apparatus for improved impedance matching arrangement which accomplishes the objective of lowering the VSWR while not having an adverse effect on the electromagnetic field in the center of a cell.

According to an embodiment of the present invention, a TEM mode test cell comprises a hollow metallic housing having an enlarged center section with opposite open ends, and a pair of end sections, each end section closing off a respective one of said center section open ends and tapering to a distal end of reduced cross sectional area. The TEM mode test cell further comprises a connector at each end section distal end, and a septum. The septum is mounted within said housing and insulated therefrom. The septum is coupled to and extending between said connectors and having a central portion joining a pair of end portions, each said end portion having a stepped contour and reducing in size toward its associated connector. Each said septum end portion has at least three steps in its contour, the slope of the transitions between steps being greatest leading to said septum central portion and being the least leading to its associated connector.

In one embodiment, the cross sectional dimension of each said septum end portion at its smallest end is approximately one fourth the cross sectional dimension of said septum central portion. In one embodiment, each septum end portion is stepped three times, and the ratio of the widest cross-sectional dimension to the axial length of the widest step is approximately 2.5 to 1. In one embodiment, the ratio of the widest cross-sectional dimension to the axial length of the middle step is approximately 5 to 1.

In one embodiment, the ratio of the widest cross-sectional dimension to the axial length of the narrowest step is approximately 2 to 1. In one embodiment, the length of each step, the cross sectional dimension at each step, and the slope of each transition between steps are predetermined to minimize voltage standing wave ratio (VSWR) within said cell. In one embodiment, said predetermined lengths, dimensions, and slopes are determined empirically.

Embodiments of the invention provide uniform electromagnetic field in the center of a test cell while appropriately matching the characteristic impedance of the septum to the 50 ohm port connectors. In one embodiment the invention provides a TEM mode cell having an internal transmission line element and at least one port on the cell, the cell comprising a stepped transmission line element coupling said internal TEM element to the port. The stepped transmission line element of the TEM mode cell has transfer characteristics selected to give maximum cancellation of VSWR in the cell and thereby enable optimum cell bandwidth.

In one embodiment of the invention, the TEM mode test cell comprises a hollow metallic housing having an enlarged center section with opposite open ends, and a pair of end sections, each end section closing off a respective one of the center section open ends and tapering to a distal end of reduced cross sectional area. A connector is provided at the distal end of each end section, and a stepped septum is mounted within the housing and insulated therefrom, the septum coupled to and extending between the connectors.

The septum has a central portion joining a pair of end portions, each end portion having a stepped contour and reducing in size toward its associated connector. At the high frequencies of operation of a TEM mode test chamber, the tapered end of the septum improves the VSWR observed at the radio/frequency (RF) port.

This stepped transmission line septum arrangement, in addition to providing a smooth impedance match coupling between the septum and the port connectors, improves the uniformity of the field in the center of the septum. That is, the stepped transmission line transformer effect reduces the VSWR resulting in a more uniform field with smoother transitions in the coupling to the port connectors, and with the reduction of VSWR, the bandwidth of the cell is extended to a higher frequency range than that which would be expected with the same physical characteristics of the septum and housing without a stepped contour in the generally tapered end portions of the septum.

FIG. 4 shows a plan view of a septum according to an embodiment of the present invention, illustrating a stepped contour on each end portion of the septum. FIG. 5 is a top view of a TEM mode test chamber in which the septum according to FIG. 4 is shown in dashed lines. Although the septum 31 shown in FIG. 4 illustrates three steps in the end portion, there is no limit to the number of steps that can be provided, although three is adequate for accomplishing the stated purpose of the invention, i.e., to provide a 50 ohm termination to the port connectors 9 at one end (the narrowed end) and an appropriate characteristic impedance coupling to the center portion 33 of septum 31 at the other end of the end portion 23 of septum 31, while maintaining a uniform electromagnetic field over a large volume at the center of the septum 31 with improved VSWR at the RF port.

According to an embodiment of the invention, the ratio of the axial length of the widest step 35 at each septum end portion 23 relative to the widest cross-sectional dimension of step 35 is approximately 2.5 to 1.

The ratio of the axial length of the middle step 37 at each septum end portion 23 relative the widest cross-sectional dimension of step 37 is approximately 5 to 1.

The ratio of the axial length of the narrowest step 39 at each septum end portion 23 relative the widest cross-sectional dimension of step 39 is approximately 2 to 1.

The ratio of cross-sectional dimension of each septum end portion 23 at its smallest end 41 is approximately one fourth the cross-sectional dimension of the center portion of the septum.

Figure 4A:
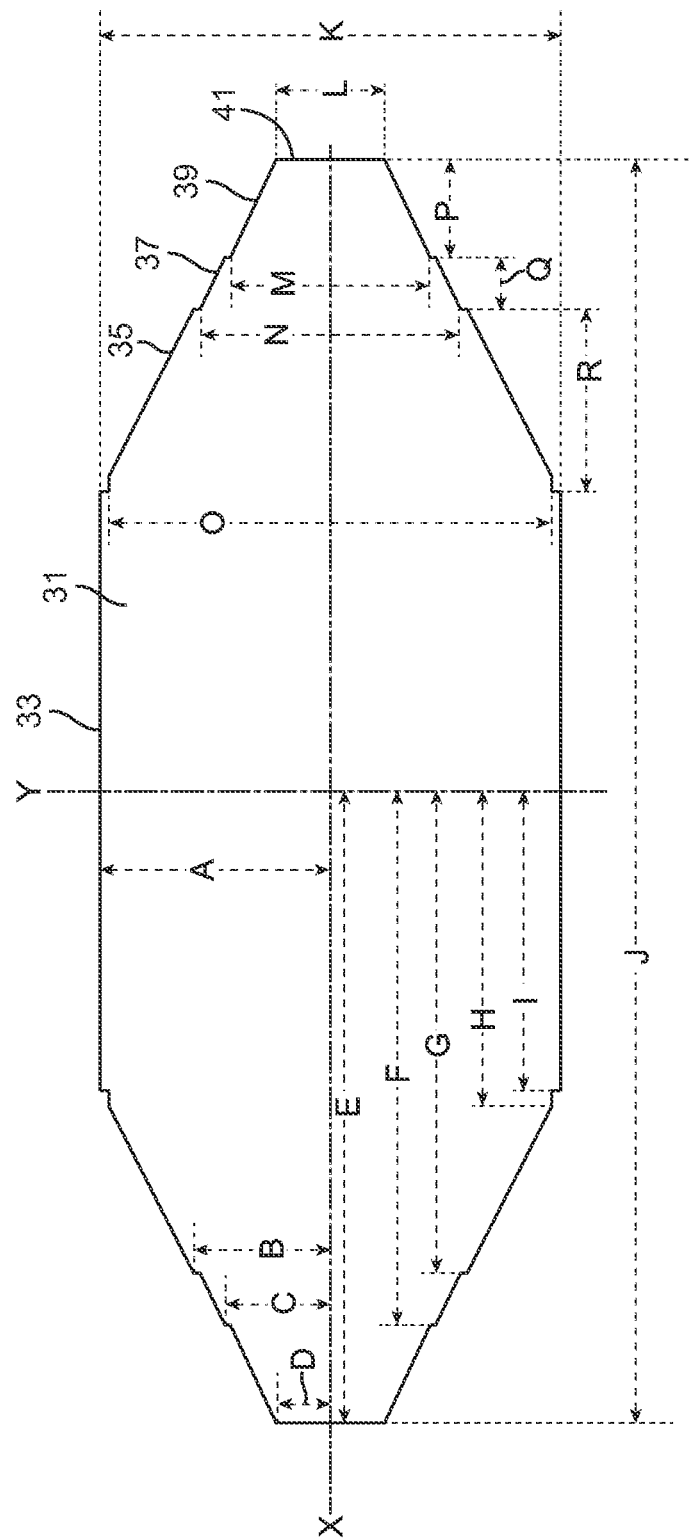
FIG. 4A illustrates a plan view of an example implementation of the septum of FIG. 4, according to an embodiment of the present invention.
Figure 5:
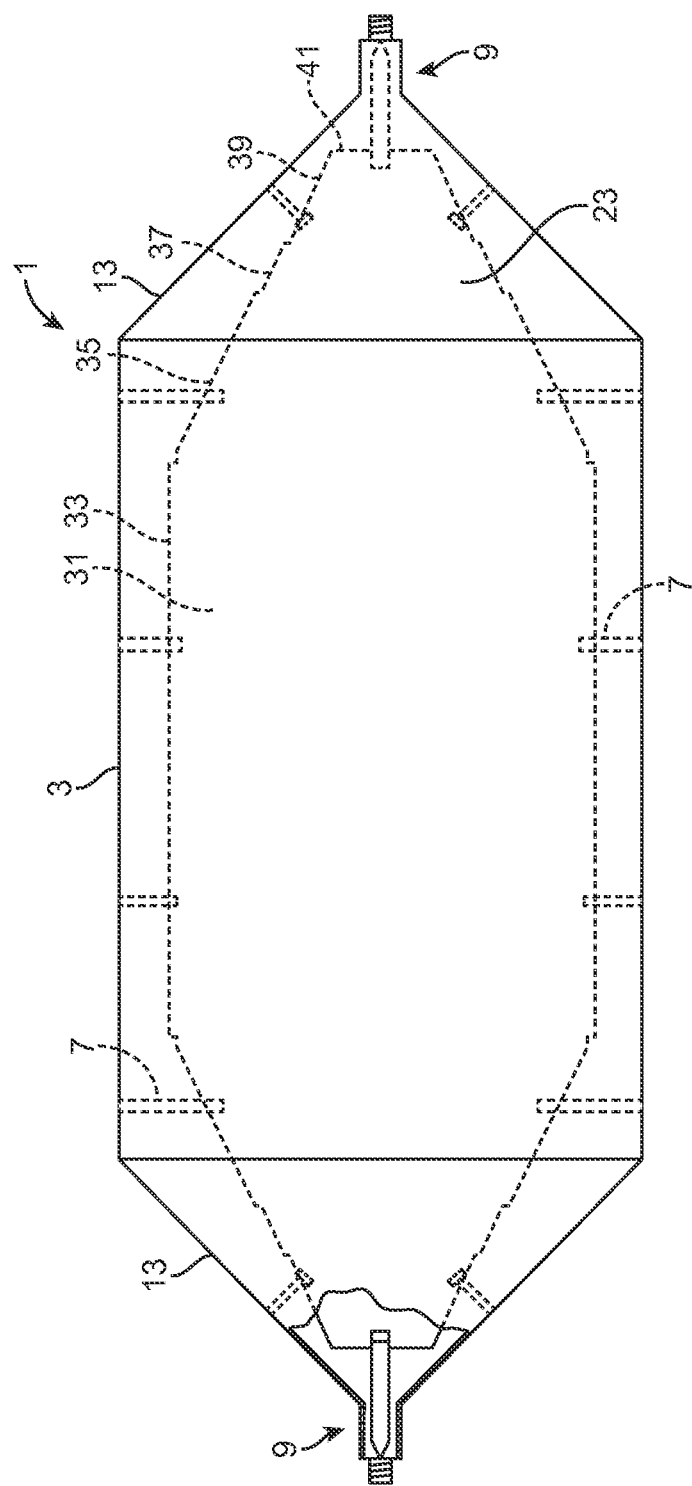
FIG. 5 shows a top view of a TEM mode test chamber of FIG. 4, according to an embodiment of the present invention.

FIG. 4A illustrates an example embodiment of the septum 31 depicted on a two-dimensional Cartesian plane, with X-axis indicating axial direction (i.e., horizontal direction), and Y-axis indicating cross-sectional direction (i.e., vertical direction). The X-axis is depicted at a centerline of the septum 31 in relation to top and bottom of the septum 31 in FIG. 4A, and the Y-axis is depicted at a centerline of the septum 31 in relation to the left and right ends of the septum 31. The septum 31 is symmetric about the X-axis centerline. The septum 31 is also symmetric about the Y-axis centerline.

Example dimensions for the septum 31 in FIG. 4A based on said ratios are as follows. Dimension A is about 53 millimeters (mm), dimension B is about 31.5 mm, dimension C is about 24.3 mm, dimension D is about 12.5 mm, dimension E is about 145.5 mm, 145.5 mm, dimension F is about 123 mm, dimension G is about 111 mm, dimension H is about 72.5 mm, dimension H is about 72.5 mm, dimension I is about 69 mm, dimension J is about 291 mm, dimension K is about 106 mm, dimension L is about 25 mm, dimension N is about 60 mm, dimension M is about 46 mm, dimension O is about 102 mm, dimension P is about 22.5 mm, dimension Q is about 12 mm, and dimension R is about 42 mm.

In this example, step 35 is about 38.5 millimeters wide in horizontal dimension (X-axis across FIG. 4A from left to right), and about 21.5 millimeters high in vertical dimension (Y-axis across the figure from top to bottom). Step 37 is about 12 millimeters wide in horizontal dimension (across the figure from left to right), and about 7.2 millimeters high in vertical dimension (across the figure from top to bottom). Step 39 is about 22.5 millimeters wide in horizontal dimension (across the figure from left to right), and about 11.8 millimeters high in vertical dimension (across the figure from top to bottom).

The dimensions of the length of each step, the angle of the transition portion between each step, the width of the septum, and other characteristics of the contour at the end portion of the septum can be mathematically calculated. However, at extremely high frequencies at which the TEM mode test chamber may be used, as opposed to attempting to account for all possible distributed impedances affecting a mathematical calculation, it is generally preferred to derive the physical characteristics of the septum design, i.e., the stepped structure at the end portions of the septum, by empirical methods.

With modern electronic test components, a series of different frequency test signals can be applied at one end of the test chamber, and by using a network analyzer to determine the characteristics of the VSWR at the RF port, minor adjustments in the design of the septum can be quickly evaluated, and an optimum design configuration can be easily arrived at in less time than entering all of the possible factors that could affect a mathematical calculation to produce the same results, and, of course, the empirical data is much more reliable insofar as accounting for all distributed capacitances and inductances in the system which might be overlooked by a mathematical calculation or misjudged as to the effect of such distribution elements.

The present invention has been described with particular reference to the specific embodiment shown in the figures, especially FIGS. 4 and 4A, in which the end portion of the septum is shown to have three steps defining the transmission line termination transformer effect. However, the present invention is not limited to the example embodiments provided herein.

In one embodiment of the invention, to provide a maximum frequency for example 3 GHz with desired VSWR characteristics, the number of steps at each end of the septum 31 is selected as three steps, and the size and angles of the steps are selected as described by example herein.

Further, the shape and size of the steps are manually created (e.g., by fine tuning typically performed with a tool such as a file or Dremel tool) to customize each septum 31 to its respective housing 3. The selection of the geometrical configuration of the septum end sections are based on accomplishing a low profile VSWR vs. frequency relationship.

The slope of the transitions between steps, and the length of each step might be altered under highly controlled empirical testing procedures to result in a more optimum design than that shown in FIG. 4 and FIG. 4A. Accordingly, it is to be understood that the design of the septum shown in FIG. 4 and FIG. 4A and described in particularity in this description is simply an example of the concept of the invention, and designs of other septum arrangements with different configurations or dimensions are considered to be within the scope of the present invention.

Figure 6:
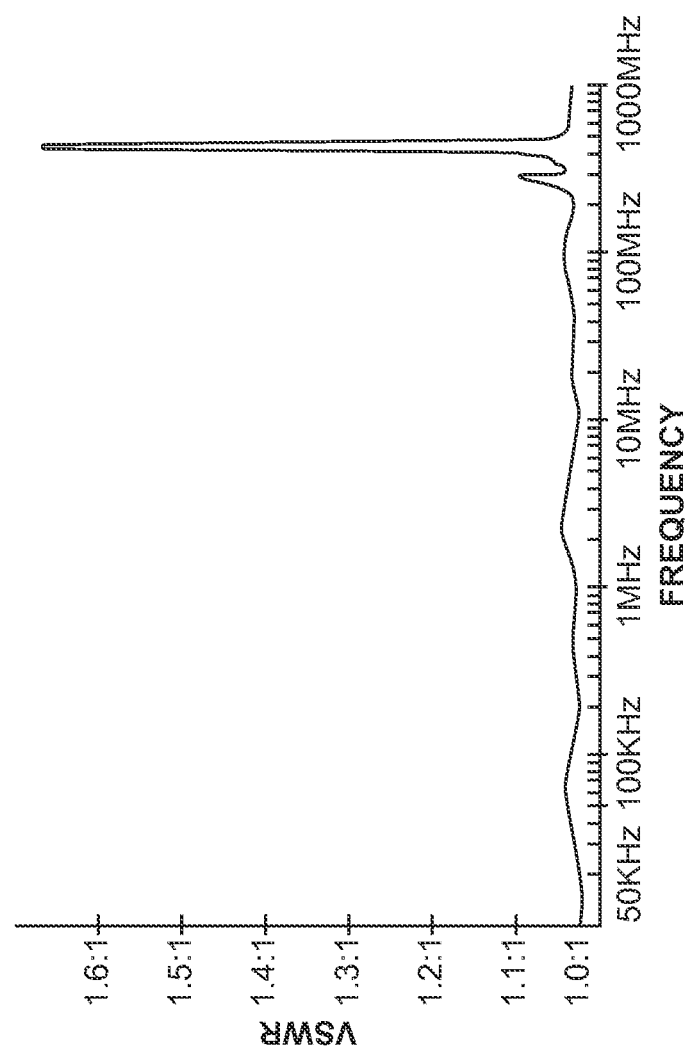
FIG. 6 shows the results of testing a prior art TEM mode test cell plotting VSWR vs. frequency.

The stepped septum design of the present invention, creating a stepped transmission line element between the center of the septum and the connecting ports reduces VSWR within the test cell. FIG. 6 shows the results of testing a prior art TEM mode test cell plotting VSWR vs. frequency. As will be observed, a first mode VSWR spike is shown at approximately 475 MHz, and a smaller VSWR perturbation is shown at approximately 300 MHz. VSWRs of 1.2 to 1 are considered to be characteristic of a good TEM cell design. In the prior art test cell results shown in FIG. 6, therefore, it can be appreciated that the cell can only be used for test procedures requiring frequencies to be less than approximately 400 MHz.

Figure 7:
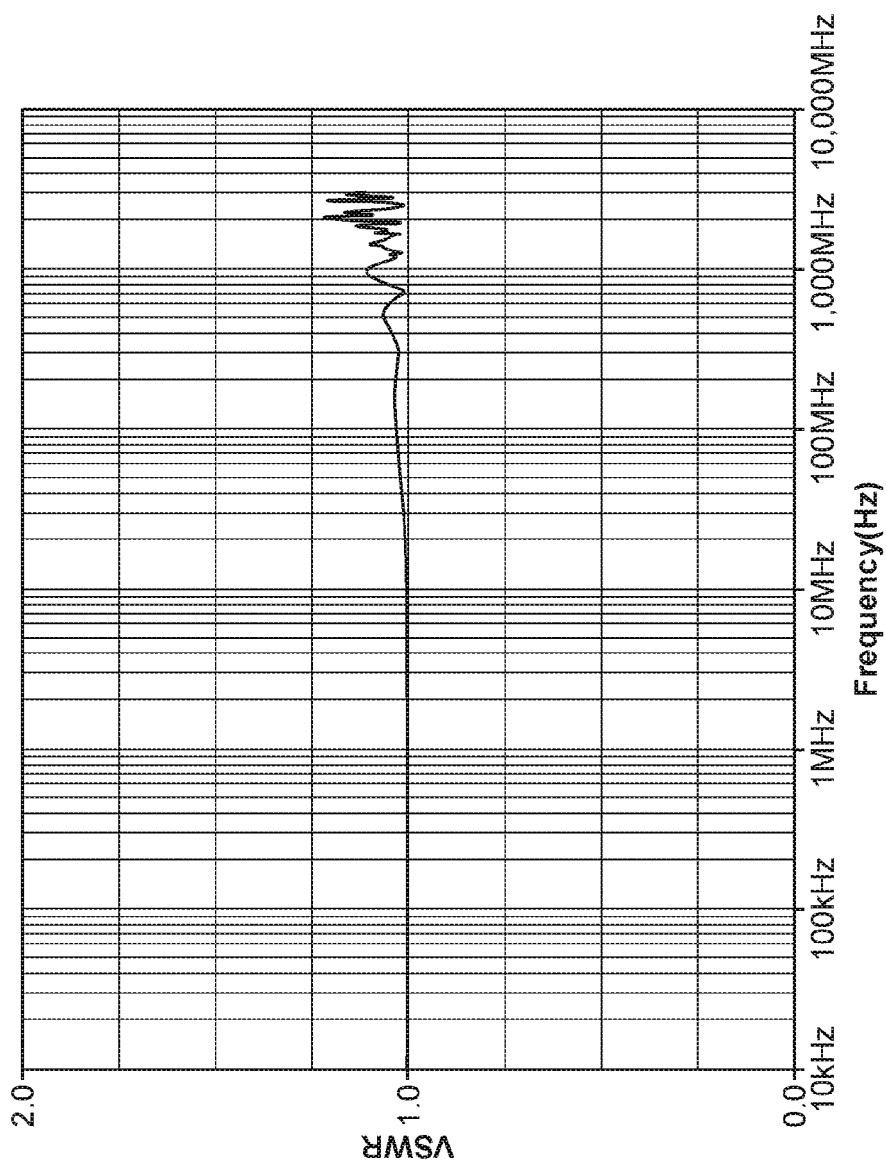
FIG. 7 shows a graph illustrating the results of a physically similar physical TEM mode test cell, but with the septum design made in accordance with the present invention installed.

The graph of FIG. 7 shows the results of a physically similar physical TEM mode test cell, but with the septum design made in accordance with the present invention installed. Here, it will be observed that there is no high amplitude VSWR occurrence within the entire frequency range up to 3,000 MHz, and the VSWR is maintained at less than 1.25 to 1 throughout the same frequency range.

In the comparison between FIGS. 6 and 7, the only difference between the prior art cell and the cell made in accordance with the present invention is the replacement of a linearly tapered septum (with its lumped termination network) by a stepped septum, and the results demonstrate the superiority of a stepped septum configuration.

In the description above, numerous specific details are set forth. However, it is understood that embodiments of the invention may be practiced without these specific details. For example, well-known equivalent components and elements may be substituted in place of those described herein, and similarly, well-known equivalent techniques may be substituted in place of the particular techniques disclosed. In other instances, well-known structures and techniques have not been shown in detail to avoid obscuring the understanding of this description.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A TEM mode test cell, comprising:
   a hollow metallic housing having an enlarged center section with opposite open ends, and a pair of end sections, each end section closing off a respective one of said center section open ends and tapering to a distal end of reduced cross sectional area;
   a connector at each end section distal end; and
   a septum mounted within said housing and insulated therefrom, said septum coupled to and extending between said connectors and having a central portion joining a pair of end portions, each said end portion having a stepped contour and reducing in size toward its associated connector, wherein each said septum end portion has at least three steps in its contour, the slope of the transitions between steps being greatest leading to said septum central portion and being the least leading to its associated connector;
whereby the test cell voltage standing wave ratio (VSWR) is less than about 1.25 to 1 in the frequency range up to about 3,000 MHz;
wherein the cross sectional dimension of each said septum end portion at its smallest end is approximately one fourth the cross sectional dimension of said septum central portion;
wherein the ratio of the axial length of the widest step to that of the middle step is approximately 3.2 to 1;
wherein the ratio of the axial length of the narrowest step to that of the middle step is approximately 1.9 to 1;
wherein the ratio of the widest cross-sectional dimension of the widest step to that of the middle step is approximately 1.7 to 1; and
wherein the ratio of the widest cross-sectional dimension of the middle step to that of the narrowest step is approximately 1.3 to 1.

2. The test cell as claimed in claim 1, wherein:
each septum end portion is stepped three times, and the ratio of the widest cross-sectional dimension to the axial length of the widest step is approximately 2.5 to 1.

3. The test cell as claimed in claim 2, wherein:
the ratio of the widest cross-sectional dimension to the axial length of the middle step is approximately 5 to 1.

4. The test cell as claimed in claim 3, wherein:
the ratio of the widest cross-sectional dimension to the axial length of the narrowest step is approximately 2 to 1 such that the test cell is essentially devoid of high amplitude VSWR occurrence within the frequency range up to 3,000 MHz.

5. The TEM mode test cell as claimed in claim 1, wherein:
the length of each step, the cross sectional dimension at each step, and the slope of each transition between steps are predetermined to minimize voltage standing wave ratio (VSWR) within said cell, such that the test cell has a usable VSWR range of about 10 KHz to 3,000 MHz.

6. The TEM mode test cell as claimed in claim 5, wherein:
the cross sectional dimension of each said septum end portion at its smallest end is approximately one fourth the cross sectional dimension of said septum central portion;
each septum end portion is stepped three times, and the ratio of the widest cross-sectional dimension to the axial length of the widest step is approximately 2.5 to 1;
the ratio of the widest cross-sectional dimension to the axial length of the middle step is approximately 5 to 1; and
the ratio of the widest cross-sectional dimension to the axial length of the narrowest step is approximately 2 to 1.

7. A TEM element for a TEM mode test cell, the TEM mode test cell including a hollow metallic housing having an enlarged center section with opposite open ends, and a pair of end sections, each end section closing off a respective one of said center section open ends and tapering to a distal end of reduced cross sectional area, and a connector at each end section distal end, the TEM element comprising:
a septum having a central portion joining a pair of end portions, each said end portion having a stepped contour and reducing in size toward its associated connector, wherein each said septum end portion has at least three steps in its contour, the slope of the transitions between steps being greatest leading to said septum central portion and being the least leading to its associated connector, such that the test cell has a VSWR range of about 10 KHz to 3,000 MHz;
wherein the length of each step, the cross sectional dimension at each step, and the slope of each transition between steps are predetermined to minimize voltage standing wave ratio (VSWR) within said cell, whereby the test cell voltage standing wave ratio (VSWR) is less than about 1.25 to 1 in the frequency range up to about 3,000 MHz;
wherein the cross sectional dimension of each said septum end portion at its smallest end is approximately one fourth the cross sectional dimension of said septum central portion;
wherein each septum end portion is stepped three times, and the ratio of the widest cross-sectional dimension to the axial length of the widest step is approximately 2.5 to 1;
wherein the ratio of the widest cross-sectional dimension to the axial length of the middle step is approximately 5 to 1;
wherein the ratio of the widest cross-sectional dimension to the axial length of the narrowest step is approximately 2 to 1;
wherein the ratio of the axial length of the widest step to that of the middle step is approximately 3.2 to 1;
wherein the ratio of the axial length of the narrowest step to that of the middle step is approximately 1.9 to 1;
wherein the ratio of the widest cross-sectional dimension of the widest step to that of the middle step is approximately 1.7 to 1; and
wherein the ratio of the widest cross-sectional dimension of the middle step to that of the narrowest step is approximately 1.3 to 1.

8. The TEM element as claimed in claim 7, wherein the test cell is essentially devoid of high amplitude VSWR occurrence within the frequency range up to 3,000 MHz.

9. A TEM mode test cell, comprising:
a hollow metallic housing having an enlarged center section with opposite open ends, and a pair of end sections, each end section closing off a respective one of said center section open ends and tapering to a distal end of reduced cross sectional area;
a connector at each end section distal end; and
a septum mounted within said housing and insulated therefrom, said septum coupled to and extending between said connectors and having a central portion joining a pair of end portions, each said end portion having a stepped contour and reducing in size toward its associated connector, wherein each said septum end portion has at least three steps in its contour, the slope of the transitions between steps being greatest leading to said septum central portion and being the least leading to its associated connector;
whereby the test cell voltage standing wave ratio (VSWR) is less than about 1.25 to 1 in the frequency range up to about 3,000 MHz;
wherein the length of each step, the cross sectional dimension at each step, and the slope of each transition between steps are predetermined to minimize voltage standing wave ratio (VSWR) within said cell, such that the test cell has a usable VSWR range of about 10 KHz to 3,000 MHz;

wherein the cross sectional dimension of each said septum end portion at its smallest end is approximately one fourth the cross sectional dimension of said septum central portion;

wherein each septum end portion is stepped three times, and the ratio of the widest cross-sectional dimension to the axial length of the widest step is approximately 2.5 to 1;

wherein the ratio of the widest cross-sectional dimension to the axial length of the middle step is approximately 5 to 1;

wherein the ratio of the widest cross-sectional dimension to the axial length of the narrowest step is approximately 2 to 1;

wherein the ratio of the axial length of the widest step to that of the middle step is approximately 3.2 to 1;

wherein the ratio of the axial length of the narrowest step to that of the middle step is approximately 1.9 to 1;

wherein the ratio of the widest cross-sectional dimension of the widest step to that of the middle step is approximately 1.7 to 1; and wherein the ratio of the widest cross-sectional dimension of the middle step to that of the narrowest step is approximately 1.3 to 1.

* * * * *